(12) United States Patent
Faul

(10) Patent No.: US 11,615,996 B2
(45) Date of Patent: Mar. 28, 2023

(54) THIN DUAL FOIL PACKAGE INCLUDING MULTIPLE FOIL SUBSTRATES

(71) Applicant: Fraunhofer-Gesellschaft zur Foerderung der angewandten Forschung e.V., Munich (DE)

(72) Inventor: Robert Faul, Munich (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 33 days.

(21) Appl. No.: 16/804,943

(22) Filed: Feb. 28, 2020

(65) Prior Publication Data
US 2020/0279785 A1    Sep. 3, 2020

(30) Foreign Application Priority Data
Feb. 28, 2019    (DE) .................... 10 2019 202 718.0

(51) Int. Cl.
*H01L 23/31*    (2006.01)
*H01L 23/49*    (2006.01)
(Continued)

(52) U.S. Cl.
CPC .......... *H01L 23/3121* (2013.01); *H01L 21/56* (2013.01); *H01L 23/3142* (2013.01);
(Continued)

(58) Field of Classification Search
CPC . H01L 23/3121; H01L 21/56; H01L 23/3142; H01L 23/49833; H01L 23/49838; H01L 23/4985; H01L 23/552
(Continued)

(56) References Cited

U.S. PATENT DOCUMENTS 5,956,232 A    9/1999    Zakel et al.
6,154,366 A    11/2000    Ma et al.
(Continued)

FOREIGN PATENT DOCUMENTS

CN    103219314 A    7/2013
DE    19500655 B4    7/1996
(Continued)

OTHER PUBLICATIONS

"JEDEC Standard MO-220".
(Continued)

*Primary Examiner* — Didarul A Mazumder
(74) *Attorney, Agent, or Firm* — Perkins Coie LLP; Michael A. Glenn

(57) ABSTRACT

A foil package includes a first foil substrate with a first and a second main surface, a second foil substrate with a first and a second main surface, wherein its first main surface is arranged facing the second main surface of the first foil substrate. The foil package includes at least one electronic device arranged between the first foil substrate and the second foil substrate and a first electrically conductive layer structure structured into a plurality of first partial areas arranged on the second main surface of the first foil substrate. The plurality of partial areas incompletely cover the second main surface of the first foil substrate. The at least one electronic device includes a terminal side and a side opposite to the terminal side.

23 Claims, 9 Drawing Sheets

(51) Int. Cl.
  *H01L 23/552* (2006.01)
  *H01L 23/498* (2006.01)
  *H01L 21/56* (2006.01)

(52) U.S. Cl.
  CPC .... *H01L 23/4985* (2013.01); *H01L 23/49833* (2013.01); *H01L 23/49838* (2013.01); *H01L 23/552* (2013.01)

(58) Field of Classification Search
  USPC ..................................... 257/414; 438/48, 49
  See application file for complete search history.

(56) References Cited

U.S. PATENT DOCUMENTS

| | | | |
|---|---|---|---|
| 6,492,203 | B1 | 12/2002 | Wakashima et al. |
| 6,617,193 | B1 | 9/2003 | Toshio et al. |
| 8,563,358 | B2 | 10/2013 | Landesberger et al. |
| 9,018,742 | B2 | 4/2015 | Nikitin et al. |
| 9,692,009 | B2 | 6/2017 | Lang et al. |
| 2001/0019179 | A1 | 9/2001 | Yoshino et al. |
| 2002/0121707 | A1 | 9/2002 | Pendse et al. |
| 2003/0035275 | A1 | 2/2003 | Kopf |
| 2003/0057525 | A1 | 3/2003 | Fock et al. |
| 2004/0119166 | A1 | 6/2004 | Sunohara |
| 2004/0232528 | A1 | 11/2004 | Ito et al. |
| 2005/0087847 | A1 | 4/2005 | Kuan et al. |
| 2005/0127503 | A1 | 6/2005 | Gobl et al. |
| 2006/0138626 | A1 | 6/2006 | Liew et al. |
| 2007/0267740 | A1 | 11/2007 | Khan et al. |
| 2008/0244902 | A1 | 10/2008 | Blackwell et al. |
| 2009/0096083 | A1 | 4/2009 | Augustin et al. |
| 2009/0127638 | A1* | 5/2009 | Kilger .................. G01L 19/141 438/51 |
| 2011/0133341 | A1 | 6/2011 | Shimizu et al. |
| 2011/0233771 | A1* | 9/2011 | Kwon .................... H01L 25/50 257/737 |
| 2012/0091594 | A1 | 4/2012 | Landesberger et al. |
| 2012/0168920 | A1 | 7/2012 | Tan et al. |
| 2013/0026650 | A1* | 1/2013 | Yamagata ............... H01L 24/97 257/774 |
| 2013/0187259 | A1 | 7/2013 | Nikitin et al. |
| 2013/0313727 | A1* | 11/2013 | Goh ....................... H01L 21/50 438/109 |
| 2014/0008777 | A1 | 1/2014 | Loh et al. |
| 2014/0104133 | A1 | 4/2014 | Finn et al. |
| 2015/0207101 | A1 | 7/2015 | Lang et al. |
| 2015/0221842 | A1 | 8/2015 | Mima et al. |
| 2015/0243642 | A1* | 8/2015 | Chen ................ H01L 23/49811 438/5 |
| 2015/0294931 | A1 | 10/2015 | Brucchi et al. |
| 2016/0374208 | A1* | 12/2016 | Chiang ................ H05K 1/0346 |
| 2017/0081175 | A1 | 3/2017 | Steiert et al. |
| 2017/0125881 | A1 | 5/2017 | Mangrum et al. |
| 2017/0207524 | A1 | 7/2017 | Cardinali et al. |
| 2017/0236776 | A1 | 8/2017 | Huynh et al. |
| 2018/0108616 | A1 | 4/2018 | Chiang et al. |
| 2018/0300597 | A1 | 10/2018 | Ng et al. |
| 2019/0334102 | A1 | 10/2019 | Fan |
| 2020/0014113 | A1 | 1/2020 | Asaka |
| 2020/0279787 | A1 | 9/2020 | Faul |
| 2020/0279797 | A1 | 9/2020 | Faul |
| 2020/0279801 | A1 | 9/2020 | Yacoub-george et al. |
| 2021/0159302 | A1 | 5/2021 | Choi et al. |

FOREIGN PATENT DOCUMENTS

| | | |
|---|---|---|
| DE | 19542883 C2 | 8/1996 |
| DE | 102006044525 B3 | 1/2008 |
| DE | 102010042567 B3 | 3/2012 |
| DE | 102013100339 A1 | 7/2013 |
| DE | 102012214411 A1 | 2/2014 |
| DE | 102014208958 A1 | 11/2015 |
| EP | 0920056 A2 | 6/1999 |
| EP | 1028463 A1 | 8/2000 |
| EP | 1256983 A2 | 11/2002 |
| EP | 1895585 A2 | 3/2008 |
| EP | 2040295 A2 | 3/2009 |
| EP | 2268110 A1 | 12/2010 |
| EP | 1548829 B1 | 10/2011 |
| JP | H0770681 B2 | 7/1995 |
| JP | H09148484 A | 6/1997 |
| JP | 2001291893 A | 10/2001 |
| KR | 102437933 B1 | 8/2022 |
| WO | 2015173031 A1 | 11/2015 |
| WO | 2015173032 A1 | 11/2015 |

OTHER PUBLICATIONS

"Quad Flat No-leads package", printout of https://de.wikipedia.org/wiki/Quad_Flat_No_Leads_Package (engl. version).

* cited by examiner

THIN DUAL FOIL PACKAGE INCLUDING MULTIPLE FOIL SUBSTRATES

CROSS-REFERENCE TO RELATED APPLICATIONS

This application claims priority from German Patent Application No. 10 2019 202 718.0, which was filed on Feb. 28, 2019, and is incorporated herein in its entirety by reference.

The present invention relates to a foil package for an electronic device and a method for producing such a foil package. The present invention relates, in particular, to a thin dual foil package.

BACKGROUND OF THE INVENTION

Nowadays, a very large part of electronic devices is available on the market with SMD packages (surface-mounted device). There are standardizations for the SMD packages for defining the geometry of the packages in width, length and height. Further, the geometries of the electrical pads (SMD pads) are defined, where the signal path runs from the system environment (printed circuit board) to the inside chip (semiconductor device).

For ensuring compatibility of the signal paths for the same functionalities of the SMD devices from different producers, the order and geometrical position of the SMD pads has to follow the standardization definition.

A second evolution of semiconductor devices (chips) is that the number of IC pads partly increases beyond several hundred per chip, wherein the geometrical size of the IC pads and the distance between the IC pads is reduced. The sum of size of the IC pads and their distance is referred to as pad pitch.

Electrical contacting of such semiconductor chips in a very small space becomes more difficult, even with very modern wire bond technologies. At the same time, frequently growing amounts of heat have to be dissipated and higher electrical currents are to be transferred. Additionally, with increasing signal bandwidths, bond wires form an attenuation or change of the wave form, partly in correlation with adjacent bond wires whose position with respect to one another is not tolerance-free due to the fine-mechanical bond machines.

Known SMD packages can be found in SMD designs with terminal pins or without terminal pins. SMD packages without terminal pins are characterized in that the electrical pads do not essentially project beyond the package body.

A common characteristic of such packages is that the package height is frequently more than 300 μm and that no significant flexibility of the package exists.

In conventional technology, there are alternative methods to SMD in the form of wafer level packages (e.g. wafer level chip scale package, WL-CSP, or fan out wafer level packages) or the integration density is increased by means of flip-chip assemblies. Flip-chip is a collective term expressing that the Si chip surface is assembled with the IC pads facing the substrate surface. In a standard SMD package, the Si chip surface is assembled facing away from the lead frame substrate. In the CSP, devices result whose top view is mostly identical with the Si chip area.

Part of the newer methods and technologies for flip-chip assembly are machines optimized particularly for assembly (flip-chip bonder) as well as materials such as ACA (anisotropic conductive adhesive) or ACF (anisotropic conductive film).

Further, in conventional technology, there are terms like BGA (ball grid array), wherein the grid dimension from ball to ball is in the range of 500 μm. The thickness (height) of such packages exceeds the 300 μm mark.

Packages providing a package whose package height is reduced to a level that is so far not offered by standardized packages (such as SMD or QFN packages) that still maintain the compatibility to the other standardized parameters, e.g. common SMD standard parameters, would be desirable.

Further, it would be desirable to provide a thin package such that the system substrate together with the package mounted thereon has a certain flexibility, which is improved compared to current systems with standardized packages (e.g. SMD or QFM packages) on printed circuit boards. Here, the term "flexibility" relates to changes of shape from a planar area to a cylindrical curvature, but not to a dome-shaped deformation. Cylindrical curvature occurs, for example, in bending specifications of smart cards.

In order to follow the objective of thin packages (having overall thicknesses of at most 350 μm, advantageously at most 300 μm, and more advantageously at most 200 μm) and in order to additionally approximate the cost structure requirements of production in competition with established package fabrications, few process steps, an efficient order of process steps and little cost-incurring material are desired.

SUMMARY

According to an embodiment, a foil package may have: a first foil substrate with a first main surface and an opposite second main surface; a second foil substrate with a first main surface and an opposite second main surface, wherein the first main surface of the second main foil substrate is arranged facing the second main surface of the first foil substrate; at least one electronic device arranged between the first foil substrate and the second foil substrate; a first electrically conductive layer structure structured into a plurality of first partial areas arranged on the second main surface of the first foil substrate, wherein the plurality of partial areas incompletely cover the second main surface of the first foil substrate; wherein the at least one electronic device includes a terminal side and a side opposite to the terminal side, wherein the terminal side is arranged facing the second main surface of the first foil substrate and includes at least a first device terminal pad and a second device terminal pad; and wherein the opposite side is arranged facing the second foil substrate; wherein the first and second device terminal pads are each electrically connected to an allocated partial area of the first electrically conductive layer structure via an electrically conductive non-detachable connection or conditionally detachable connection; wherein the foil package further includes a casting compound arranged between the first foil substrate and the second foil substrate mechanically contacting the first foil substrate and the at least one electronic device and delimiting the same with respect to the environment; wherein the foil package further includes a second electrically conductive layer structure structured into a plurality of package pads arranged on the second main surface of the second foil substrate, wherein the plurality of package pads incompletely cover the second main surface of the second foil substrate; wherein at least a first electrically conductive path is arranged that electrically connects, by means of a via, a first package pad to a partial area of the first electrically conductive layer structure and hence to the first device terminal pad; and a second electrically conductive path is arranged that electrically connects, by means of a via, a second package pad to a partial area of the first electrically conductive layer structure and hence to the second device terminal pad; wherein the terminal side of the at least one electronic device extends in a reference plane and a projection of the first package pad and the second package pad into the reference plane is laterally adjacent and disjoint to the terminal area; wherein the first package pad and the second package pad are arranged in a planar area parallel to the reference plane within a first tolerance range; wherein the at least one electronic device includes a dimension ($d_4$) along a thickness direction perpendicular to the reference plane that is less than 60 µm; and wherein the first foil substrate includes a dimension ($d_1$) along a thickness direction that is less than 130 µm; and wherein the second foil substrate includes a dimension ($d_2$) along the thickness direction that is less than 130 µm and wherein the first electrically conductive layer structure includes a dimension along the thickness direction that is less than 20 µm.

According to another embodiment, a method for producing a foil package may have the steps of: providing a first foil substrate with a first main surface and an opposite second main surface; providing a second foil substrate with a first main surface and an opposite second main surface; arranging at least one electronic device between the first foil substrate and the second foil substrate; such that the at least one electronic device includes a terminal side and a side opposite to the terminal side, such that the terminal side is arranged facing the second main surface of the first foil substrate and includes at least a first device terminal pad and a second device terminal pad; and such that the opposite side is arranged facing the second foil substrate; arranging a first electrically conductive layer structure structured into a plurality of first partial areas on the second main surface of the first foil substrate, such that the plurality of partial areas incompletely cover the second main surface of the first foil substrate; connecting the first and second device terminal pad each via an electrically conductive non-detachable connection or conditionally detachable connection to an allocated partial area of the first electrically conductive layer structure; arranging a casting compound between the first foil substrate and the second foil substrate contacting the first foil substrate and the at least one electronic device and delimiting the same with respect to the environment; arranging a second electrically conductive layer structure structured into a plurality of package pads on the second main surface of the second foil substrate such that the plurality of package pads incompletely cover the second main surface of the second foil substrate; arranging at least one first electrically conductive path electrically connecting, by means of a via, a first package pad to a partial area of the first electrically conductive layer structure and hence to the first device terminal pad; and a second electrically conductive path electrically connecting, by means of a via, a second package pad to a partial area of the first electrically conductive layer structure and hence to the second device terminal pad; such that the terminal area of the at least one electronic device extends in a reference plane and a projection of the first terminal pad and the second terminal pad into the reference plane is laterally adjacent and disjoint to the terminal area; such that the first package pad and the second package pad are arranged in a planar area parallel to the reference plane within a first tolerance range; such that the at least one electronic device includes a dimension along a thickness direction perpendicular to the reference plane that is less than 60 µm; and such that the first foil substrate includes a dimension along the thickness direction that is less than 130 µm; and such that the second foil substrate includes a dimension along the thickness direction that is less than 130 µm; and such that the first electrically conductive layer structure includes a dimension along the thickness direction that is less than 20 µm.

According to one embodiment, a foil package includes a first foil substrate with a first main surface and an opposite second main surface. Further, a second foil substrate with a first main surface and an opposite second main surface is arranged, wherein the first main surface of the second foil substrate is arranged facing the second main surface of the first foil substrate. The foil package includes at least one electronic device arranged between the first foil substrate and the second foil substrate as well as a first electrically conductive layer structure structured into a plurality of first partial areas arranged on the second main surface of the first foil substrate, wherein the plurality of partial areas incompletely cover the second main surface of the first foil substrate. The at least one electronic device comprises a terminal side and a side opposite to the terminal side, wherein the terminal side of the second main surface is arranged facing the first foil substrate and comprises at least a first device terminal pad and a second device terminal pad. The opposite side is arranged facing the second foil substrate. The first and second device terminal pads are each electrically connected to an allocated partial area of the first electrically conductive layer structure via an electrically conductive non-detachable connection or conditionally detachable connection. Further, the foil package comprises a casting compound arranged between the first foil substrate and the second foil substrate mechanically contacting the first foil substrate and the at least one electronic device and delimiting the same with respect to the environment. The foil package includes a second electrically conductive layer structure structured into a plurality of package pads arranged on the second main surface of the second foil substrate. The plurality of package pads cover the second main surface of the second foil substrate incompletely. At least a first electrically conductive path is arranged that electrically connects, by means of a via, a first package pad to a partial area of the first electrically conductive layer structure and hence to the first device terminal pad. A second electrically conductive path is arranged that electrically connects, by means of a via, a second package pad to a partial area of the first electrically conductive layer structure and hence to the second device terminal pad. The terminal area of the at least one electronic device extends in a reference plane. A projection of the first terminal pad and the second terminal pad into the reference plane is laterally adjacent and disjoint to the terminal area. The first package pad and the second package pad are arranged in a planar area parallel to the reference plane within a first tolerance range. The at least one electronic device has a dimension along a thickness direction perpendicular to the reference plane that is less than 60 µm which provides a flexibility of the electronic device. Alternatively or additionally, the first foil substrate and/or the second foil substrate are configured such that a dimension of the respective foil substrate along the thickness direction with respect to the electronic device is less than 130 µm. Alternatively or additionally, the first electrically conductive layer structure has a dimension along the thickness direction that is less than 20 µm.

This enables a package fulfilling specific criteria of common standardizations and comprising a significantly lower structural height than currently available packages. This can be realized due to the reduced layer thicknesses in the layer structure of the package and here, in particular, due to the specific substrate in the form of the two foil substrates, whereby the entire package is additionally configured in a flexible manner.

BRIEF DESCRIPTION OF THE DRAWINGS

Embodiments of the present invention will be detailed subsequently referring to the appended drawings, in which.

DETAILED DESCRIPTION OF THE INVENTION

Before embodiments of the present invention will be discussed in detail based on the drawings, it should be noted that identical, functionally identical or equal elements, objects and/or structures in different figures are provided with the same reference numbers, such that the description of these elements illustrated in different embodiments is inter-exchangeable or inter-applicable.

The inventive foil package is herein also referred to as "foil-based package" or "dual foil package". Above that, the terms "package" and "housing" are used synonymously herein. The term "thin" with respect to the foil package relates to a thickness of at most 350 µm, advantageously thicknesses of at most 300 µm and more advantageously to thickness of at most 200 µm. The thickness corresponds to a layer thickness structure of the foil package perpendicular to the main extension direction of the foil substrates or perpendicular to the foil planes. Substrates having layer thicknesses of below 130 µm are also referred to as "foil substrate" in the sense of the present description.

Inventive foil packages include at least one electronic device. The same can, for example be formed as a semiconductor chip or include the same. Embodiments relate to chips that are embedded in a foil package. Included in the term "chip" are configurations with silicon material other semiconductor substrates, thin glass or foil materials. However, embodiments are not limited thereto. Alternatively or additionally, instead of a "chip", a foil device can be arranged which can optionally also provide sensory functionality. Non-limiting examples for sensory functions on a foil substrate can be inter-digital capacitor structures, amperometric electrodes, resistor meanders, light-sensitive, humidity-sensitive, gas-sensitive, pH-sensitive layers and/or bioanalytical layers, wherein additional functions are also possible. A possible foil thickness is, for example, in the range of 25 µm and is in the definition range for the nomenclature "thin chips". Since the production requirements for structures on the foil chip can differ from the production requirements for package production, it can be useful to embed a foil chip into a foil package.

Despite the intended thin configuration or low structural height, it can be useful to arrange the above-mentioned semiconductor devices or chips in a package to simplify transport, handling and/or assembly.

Figure 1:
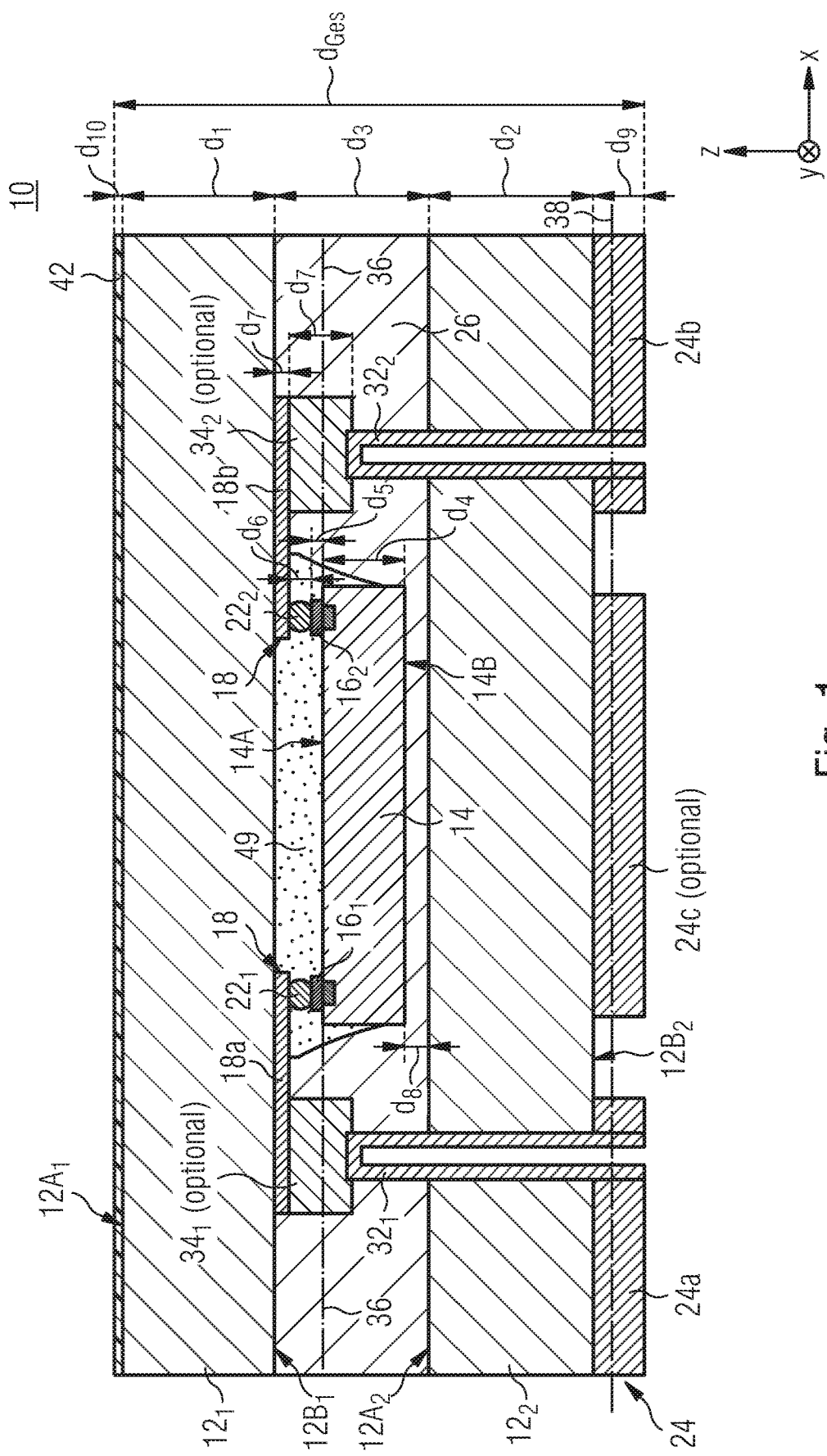
FIG. 1 is a schematic side-sectional view of a foil package according to an embodiment.

FIG. 1 shows a schematic side-sectional view of a foil package 10 according to an embodiment. The foil package 10 includes a foil substrate $12_1$ and a foil substrate $12_2$ arranged opposite to one another. The foil substrate $12_1$ and $12_2$ are seen as configured comparatively large in an expansion plane such that opposite main sides $12A_1$ and $12B_1$ of the foil substrate $12_1$ and/or $12A_2$ and $12B_2$ of the foil substrate $12_2$ have a significantly greater area than a lateral area of the foil substrate connecting the main sides $12A_1$ and $12B_1$ and $12A_2$ and $12B_2$, respectively. Without meant to be limiting, the main surfaces can be considered as top or bottom of a planar substrate.

The main surfaces $12B_1$ and $12A_2$ are arranged facing each other but spaced apart from one another, such that a space results between the two main surfaces $12B_1$ and $12A_2$.

The foil package 10 includes an electronic device 14 arranged between the foil substrate $12_1$ and $12_2$. The electronic device 14 can be an above-explained chip. The electronic device 14 can comprise two or more device terminal pads $16_1$ and $16_2$, by means of which electrical potentials can be applied to the electronic device 14 and/or by means of which electrical potentials, i.e. signals can be received or tapped from the electronic device 14. The device terminal pads $16_1$ and $16_2$ can be arranged on the same terminal side 14A.

The foil package 10 includes a structured electrically conductive layer structure 18 including one or several layers structured, for example in a first partial area 18a and a second partial area 18b, such that the partial areas 18a and 18b electrically contact each other and at most indirectly via additional electrical connections. Thereby, the partial areas 18a and 18b incompletely cover the main surface $12B_1$ where the electrically conductive layer structure 18 is arranged.

The partial areas 18a and 18b are electrically isolated, galvanically isolated or merely galvanically connected via a circuit implemented in the electronic device 14. The electrically conductive layer structure 18 is arranged on the main surface $12B_1$ of the foil substrate $12_1$.

The terminal side 14A is arranged facing the main surface $12_1$ and hence the electrically conductive layer structure 18, such that a side 14B of the electronic device 14 opposite to the terminal side 14A is facing the foil substrate $12_2$, more specifically the main surface $12A_2$.

The foil package 10 includes connections $22_1$ and $22_2$, wherein each of the connections $22_1$ and $22_2$ establishes an electrically conductive non-detachable or conditionally detachable connection between an allocated device terminal pad $16_1$ or $16_2$ and an allocated partial area 18a or 18b of the electrically conductive layer structure 18. For example, a metallization can include, for example, a solder connection or an adhesive connection including an anisotropic conductive adhesive or a respective adhesive foil. The connections $22_1$ and $22_2$ can include a metallization and can be realized, for example, as bump metallization.

Alternatively or additionally, an assembly material 49 can be used, which can also have adhesive and/or electrically connecting characteristics, for example location and/or direction selective. This means that the assembly material can also fulfill the function of the connections $22_1$ and/or $22_2$, such as anisotropic conductive adhesive or anisotropic conductive adhesive foil. Although an arrangement of the electrically conductive connection can be configured between the device terminal pad and the allocated partial area by means of a separate object, such as a bump or pillar, it should be noted that the chip assembly material 49 and the chip contact material 22 include a common material system in the case of using ACA or ACF technology, while it can be separate materials in the case of stud bumps or pillar technology.

Due to the connections $22_1$ and $22_2$ there is an electrical signal connection between IC bump and the metallization of the electrically conductive layer structure 18 in the foil package, which can be realized in a low-resistance manner by the fact that in the assembly process of chip on foil substrate $12_1$, conductive elements are arranged or exist between the surface of the bumps and the surface of the metallization or a direct low-resistance contact of metallization and bump exists. Such conductive elements exist, for example, in anisotropic conductive adhesives or anisotropic conductive adhesive foils. In the architecture of the foil package, the chip surface with the bumps can face that surface of the foil substrate $12_1$ comprising the electrically conductive layer structure 18, which can correspond to a flip-chip orientation. This allows omission of the arrangement of bond wires. For the case that a direct low-resistance contact of bump and electrically conductive layer 18 is implemented, the elements $22_1$ and $22_2$ arranged between bump and electrically conductive layer structure can be replaced by the low-resistance contact path or the immediate contact, e.g. pillar and electrically conductive layer. A bump is a conductive structure topographically projecting from the metallization of the IC pad beyond the surface IC passivation, such that the bumps in the order of, for example, 2, 3 or 4 μm represent topography on the IC pad-side surface. A pillar is a metallic structure whose lateral dimension is less than the area of an IC pad and whose height can be in the order of, for example, 10, 15, 20, 25 or 30 μm.

Although the electronic device 14 is represented such that the same includes two device terminal pads $16_1$ and $16_2$, a different, in particular higher number of device terminal pads can be realized. This means the electrically conductive layer structure 18 can be structured in a plurality of signal paths providing part of a respective electrical connection of a number, in particular a plurality of device terminal pads to the electrically conductive layer structure 24, in particular package pads. Such a number can be at least 3, at least 5, at least 10 or even at least 20, 50 or 100. The electrically conductive layer structure 18 can include an at least same number of partial areas, such that each device terminal pad can be connected to one partial area. Although this does not exclude that several device terminal pads 16 are connected to a common partial area, embodiments intend to provide individually allocated partial areas.

A further electrically conductive layer 24, comprising a corresponding and associated partial area 24a and 24b at least for each of the partial areas 18a and 18b is arranged on the foil substrate $12_2$, more accurately at the main surface $12B_2$. Optionally, further or additional partial areas, such as the partial area 24c can be provided, such as for implementing additional functionalities, such as heat dissipation or shielding. The partial areas 24a, 24b and 24c can be separate and spaced apart from one other, such that the electrically conductive layer structure 24 incompletely covers the main surface $12B_2$. The partial areas 24a and 24b of the electrically conductive layer structure 24 allocated to the partial areas 18a and 18b can represent package terminal pads where the package 10 can be electrically contacted.

In the even or uncurved state illustrated in FIG. 1, the foil substrates $12_1$ and $12_2$ as well as the electronical device 14 can extend independent of one another in a plane parallel to an x/y plane in space. A direction perpendicular thereto, such as a z direction, can be considered as a thickness direction. Along this thickness direction z, the foil substrates $12_1$ and $12_2$ have dimensions $d_1$ or $d_2$. The same can be individually chosen, but can also be the same. Values for the thicknesses $d_1$ and/or $d_2$ can, for example, be less than 150 μm, approximately 125 μm, approximately 50 μm or approximately 25 μm.

A distance between the foil substrates $12_1$ and $12_2$ can contribute additional thickness $d_3$ or a thickness contribution or a thickness component to an overall thickness of the foil package 10. The thickness $d_3$ can be selected such that the electronic device 14 can at least be received via components of the device terminal pads $16_1$ and $16_2$ projecting beyond the terminal side 14A, the connections 22 as well as the electrically conductive layer structure 18. In that way, for example, a thickness $d_4$ of the electronic device 14 can be different and can have values of 100 μm or more, as long as flexibility of the foil package 10 is not needed or not desired. Alternatively, it is possible that the thickness $d_4$ has, for example, a value of less than 100 μm such as at most 70 μm, at most 60 μm or at most 50 μm which allows, with decreasing thickness $d_4$, an increasing flexibility of the electronic device 14 and hence the foil package 10. The flexibility relates to the characteristic of the foil package 10 to be provided with bending without damaging individual components of the same, in particular the electronic device 14 or the overall package 10, even when a repeated bending such as five times, ten times or twenty times takes place.

The foil package 10 includes a casting compound 26 arranged between the foil substrate $12_1$ and $12_2$ and that mechanically contacts the electronic device 14 at least in areas and delimits the same with respect to the environment based on the mechanical contact. The layer thickness $d_3$ can be selected such that a sum of possibly needed layer thicknesses $d_4$, $d_5$ for the projections of the device terminal pads $16_1$ and/or $16_2$ $d_6$ of the connections 22 and $d_7$ of the electrically conductive layer structure can at least be compensated, optionally even overcompensated, such that the side 14B of the electronic device opposite to the terminal side 14A is also covered by the casting compound 26, for example with a thickness of $d_8$.

In real configurations, the illustrated flushness can be deviated from, such that package pad and chip compound are possibly not exactly flush, for example since the chip compound can include a shrinking process during processing or this can be caused by other production-related reasons. Basically, the term flushness is not in opposition to production-related tolerances.

The thickness $d_7$ is, for example, less than 20 μm, advantageously less than 19 μm and particularly advantageously less than 18 μm. The distance $d_7$ is, for example, approximately 10 μm and can be set to higher values $d_7'$, for example less than 20 μm, i.e. $d_7' < 20$ μm by arranging the electrically conductive element $34_1$ and/or $34_2$ as further layer at the electrically conductive layer 18. The electrically conductive elements $34_1$ and/or $34_2$ can also be part of the layer structure 18. In other words, the metallization of the layer structure 18 in the figures can actually consist of two layer thicknesses, namely $d_7$ and $d_7{}'$, wherein there could also be embodiments where only one layer thickness exists, which should be so thick for production-related reasons, the contacting progress works without piercing the metallization layer.

An overall thickness $d_{Ges}$ can have any thin value. In the sense of thin packages, it is advantageous to implement the overall thickness $d_{Ges}$ such that the same has a value of at most 350 μm, advantageously at most 250 μm and more advantageously at most 200 μm.

The foil package 10 further comprises vias $32_1$ and $32_2$ extending, starting from the package pads 24a and 24b, through the foil substrate $12_2$ and at least part of the casting compound 26 in the direction of the partial areas 18a and 18b. The via $32_1$ and/or the via $32_2$ can include a hole structure subsequently filled with a metallization. Alternatively or additionally, the via $32_1$ and/or the via $32_2$ can be configured in a plugged-via shape. Materials suitable for a respective via can, for example, include a copper material, a gold material, a silver material, another metal material or an alloy including at least one metal material.

Optionally, the via $32_1$ can be electrically and mechanically connected to an electrically conductive element $34_1$, which at the same time establishes electrical and mechanical contact to the partial area 18a. In the same way, the via $32_2$ can be optionally electrically and mechanically connected to the partial area 18b via an electrically conductive element $34_2$. The electrically conductive elements $34_1$ and/or $34_2$ can be considered as additional layer thickness or thickening of the electrically conductive layer structure 18 in an area of the provided mechanical and electrical contact to the vias $32_1$ or $32_2$. This enables simple production despite possibly occurring production tolerances, by ensuring that a possible subsequent separation of the foil substrate $12_2$ and the casting compound 26 for inserting the vias $32_1$ and $32_2$ is performed such that the partial areas 18a and 18b are not accidentally penetrated or pierced which could led to reduced member efficiency or even defects. By arranging the electrically conductive elements $34_1$ and $34_2$, additional material can be provided, which can then be also partly removed again after separation or detachment without endangering or affecting the functionality of the devices.

A dimension of the electrically conductive layer structure 18 in the area of the contact with the electrical path or the electrical via $32_1$ and/or $32_2$ can be enlarged in an area of the connections $22_1$ and $22_2$ compared to a dimension along the thickness direction z.

By the presence of the vias $32_1$ and $32_2$, electrical paths can be obtained that, on the one hand, connect the package terminal pad 24a to the partial area 18a and to the device terminal pad $16_1$ via the connection $22_1$, such that the device terminal pad $16_1$ can be electrically contacted at the package terminal pad 24a, and on the other hand connects the package terminal pad 24b to the partial area 18b, and to the device terminal pad $16_2$ via the connection $22_2$, such that the device terminal pad $16_2$ can be electrically contacted at the package terminal pad 24b.

By the via $32_2$, a further electrical path can be obtained between the device terminal pad $16_2$ via the connection $22_2$ across the partial area 18b towards the package terminal pad 24b, such that the device terminal pad $16_2$ can be electrically contacted.

The terminal side 14 forms part of a reference plane 36, which means the terminal side 14A extends in the reference plane 36. Projections of the package terminal pads 24a and 24b into the reference plane 36, for example parallel to the z direction and/or along a surface normal of the reference plane 36, are laterally adjacent and spaced apart from the terminal area 14A. This means the projections of the package pads 24a and 24b are laterally adjacent and disjoint to the terminal area 14A. In other words, the package pads 24a and 24b are beside the electronic device 14.

The package pads 24a and 24b can be arranged simultaneously within a tolerance range in a planar area or plane 38 parallel to the reference plane 46. The tolerance range can, for example, be production-related or can support flexibility of the package, and, for example, have a certain order. This means the tolerance range can extend, for example, from 0.1 μm to 1 μm, 0.5 μm to 5 μm or 1 μm to 10 μm or the same. Tolerance ranges having an upper limit in the single-digit μm-range, this means that are smaller than 10 μm are advantageous. Tolerances can be caused due to the fact that for a flexible foil base as is the case here, a planar even surface or area without any tolerances is hardly possible or impossible.

The electronic device 14 can be installed in the foil package 10 similar to a flip-chip configuration, this means the device terminal pads $16_1$ and $16_2$ can be arranged facing away from the package pads 24a and 24b. Since the electrically conductive paths, the vias $32_1$ and $32_2$ as well as optionally the electrically conductive elements $34_1$ and $34_2$ laterally pass along the electronic device 14, and are configured to route an electrical signal between the device terminal pad $16_1$ and the package pad 24 or to route an electrical signal between the device terminal pad $16_2$ and the package pad 24b, the electronic device 14 is still easy to contact.

The casting compound 34 can at least partly adjust the distance $d_3$ between the foil substrates $12_1$ and $12_2$. The electronic device 14 is arranged completely within the area of the distance.

The foil substrate $12_1$ and/or the foil substrate $12_2$ can be configured in a flexible manner. This enables that the foil package 10 is bendable without damage and without damage of the electronic device 14.

A bending radius RB of the one-dimensional bending can be at least 100 times, at least 150 times or at least 200 times greater than a dimension of the foil package 10 along the thickness direction z, this means a sum of the thicknesses $d_1$, $d_2$, $d_3$, $d_9$ of the electrically conductive layer 24 as well as further layers, such as a thickness $d_{10}$ of a layer 42 arranged on the main surface $12A_1$, which will later be discussed in detail.

The foil substrates $12_1$ and/or $12_2$ can comprise a flexible material. For this, the usage of polyimide layers, a polyethylene naphthalate layer, a polyethylene terephthalate layer and a polycarbonate layer is suitable.

Although the foil package 10 is described such that merely a single electronic device 14 is arranged, a plurality or multitude of electronical devices can simultaneously be embedded in the foil package. In that way, different functionalities or a plurality of one functionality can be implemented in different electronic devices.

The package terminal pads 24a and 24b, in particular the entirety of implemented package terminal pads can be arranged in existing standard pattern, such as according to an SMD raster or a QFN raster (quad flat no leads raster).

Returning to the layer 42, which is arranged on the main surface $12A_1$ of the foil substrate $12_1$, optionally, however, alternatively or additionally also on the main surface $12B_2$ or a side of the electrically conductive layer structure 24 facing away from the foil substrate 12 or optionally can also be omitted, the layer 42 can be used as barrier structure providing a barrier for humidity and/or electromagnetic radiation. That way, the layer 42 can for example be formed impermeable for humidity and/or moisture.

Alternatively or additionally, the barrier layer 42 can be formed in an electrical low-resistance manner and provide electrical shielding, wherein for this an electrical contacting of the barrier layer 42 with an electrical potential, in particular a reference potential, such as 0 volt or ground is advantageous.

Figure 2:
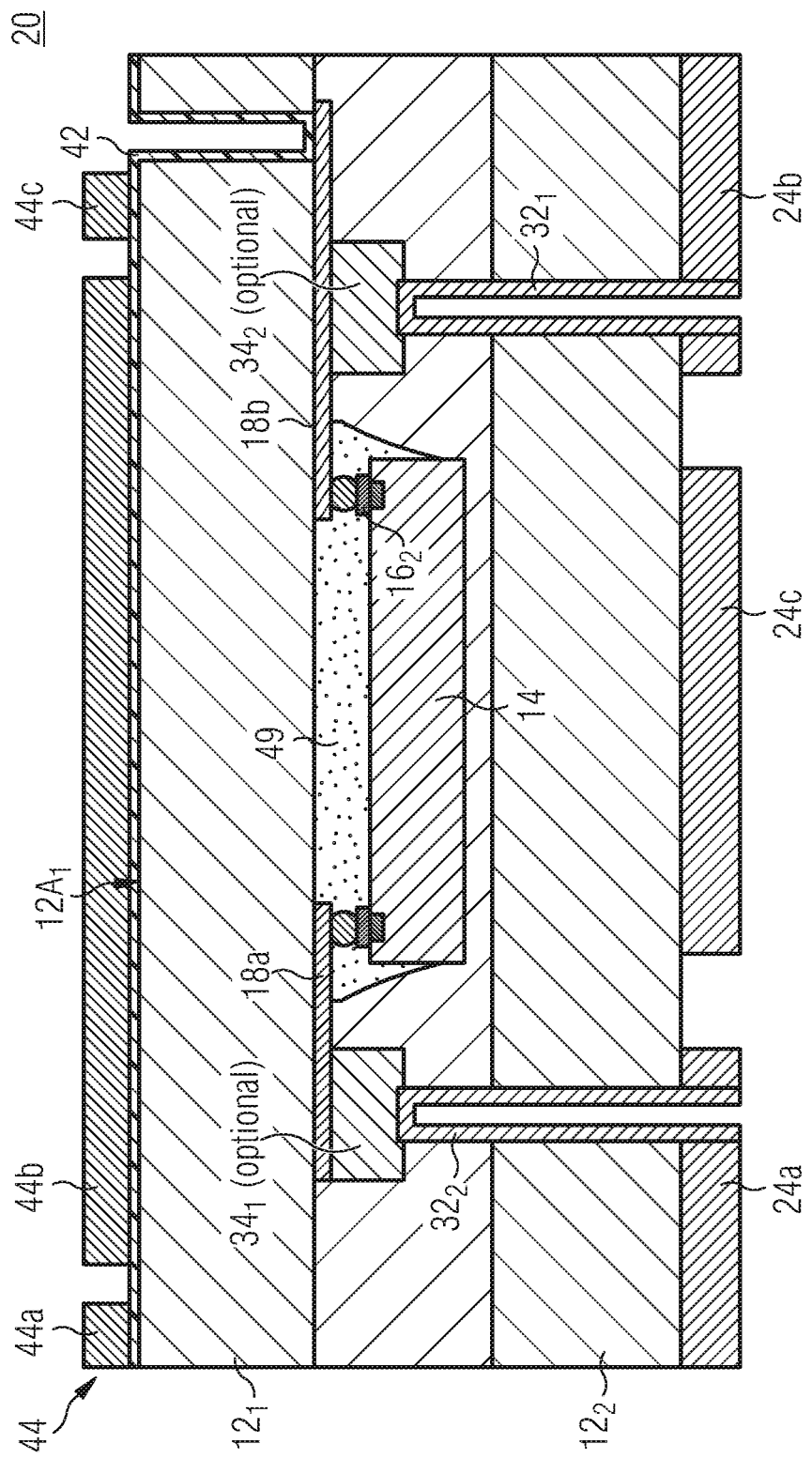
FIG. 2 is a schematic side-sectional view of a foil package according to an embodiment where an outer barrier structure is mechanically and electrically connected to an electrically conductive partial area of an inner layer structure.

FIG. 2 shows a schematic side-sectional view of a foil package 20 according to an embodiment which can be structured in a similar manner as the foil package 10. Contrary to the description for the foil package 10, the barrier structure 42 can be mechanically and electrically connected to the partial area 18b. For this, the barrier structure 42 has an electrical low-resistance conductive layer that is electrically connected to the electrically conductive layer structure 18, such as to such a partial area that is also connected to a supply potential of the electronic device. For example, a supply potential of the electronic device 14 can be connected to the device terminal pad $16_2$ electrically connected to the barrier structure 42 and/or the package terminal pad 24b, such as to provide electrical shielding. In the sense of the present disclosure, electrical low-resistance means an order that is, at maximum, in a single-digit range of ohm per square wherein one square corresponds to a square as part of the electrically conductive layer.

Alternatively or additionally, the barrier structure 42 can comprise a barrier layer that is formed in an electrically isolating manner. Such a layer can, for example, cover the layer connected to the partial area 18b and can provide, in addition to electrical shielding by the electrically conductive layer protection from further environmental influences, such as humidity. Such a layer can at least partly form an outside of the foil package.

Again referring to FIG. 1, an electrically isolating layer can also be arranged without an electrically conductive layer of the barrier structure 42, such as when electrical contacting of further elements is not needed or not desired.

As an alternative or in addition to the barrier layer 42, a material layer 44 can be arranged on a side of the main surface $12A_1$, which can be arbitrarily structured and/or thinned, for example to provide labeling of the foil package 20. In that way, individual partial areas 44a, 44b and/or 44c that are spaced apart from one another and/or connected by thin residual layers can be obtained in any number.

In other words, FIG. 2 outlines an electrically conductive connection between cover layer 42 and layer 18. The outlined location of this connection is variable with respect to the illustration. Additionally, a further cover layer 44 is schematically outlined which can correspond, for example, to a labeling.

Figure 3A:
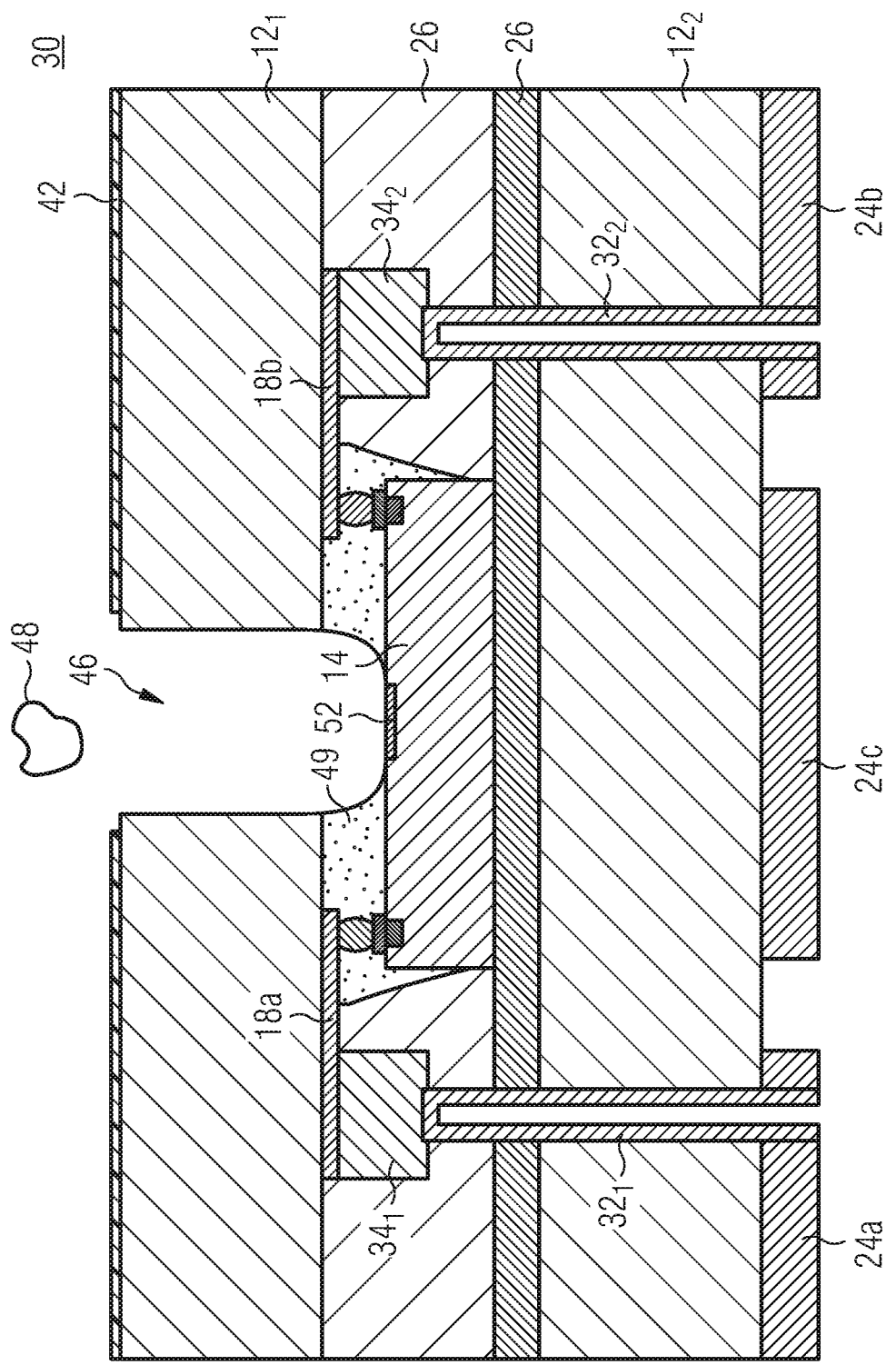
FIG. 3a is a schematic side-sectional view of a foil package according to an embodiment comprising a medium opening.

FIG. 3a shows a schematic side-sectional view of a foil package 13 according to an embodiment. Compared to the foil package 10, the foil package 13 comprises a medium opening 46, which opens the foil package 30 such that a solid, liquid or gaseous medium 48 can reach the electronic device 14 in order to contact the electronic device 14. Thus, the electronic device 14 can comprise a sensory area 52 exposed by means of the medium opening 46. The sensory area 52 can be sensitive, for example to a component of the medium 48, for a temperature, a density or another characteristic of the medium 52. A further example for a sensory function with medium contact can alternatively be a humidity sensor package or a gas sensor or a fluid sensor (liquid analysis) or a medical sensor. The electronic device 14 can be configured to output at least one signal to at least one package terminal 24a and 24b, which is based on the interaction of the sensory area 52 with the medium 48.

Although the foil package 30 is described such that the area 52 is sensory, the embodiments described herein are not limited thereto, but allow alternatively or additionally that an actuator is implemented in the area 52 such that based on a signal applied to the electronic device 14 the medium 48 is influenced, such as by illumination, irradiation, heating or the like.

Although the foil substrate 30 is illustrated such that the medium opening 46 is part of the foil substrate $12_1$, the medium opening 46 can alternatively or additionally also be implemented in the foil substrate $12_2$ as well as the casting material 34.

In other words, sensor chips are widely known, which can coarsely be divided into those sensory functions needing no medium contact for detecting sensor signals or those sensory functions needing medium contact. An example for a sensory function without medium contact is an acceleration sensor. An example for a sensory function with medium contact is a medical analysis sensor contacted by a serum (medium) to be sensory examined or by a gaseous medium on the chip surface to generate a sensor signal. Optical sensors can have an ambiguous position in the context of flex foil packages since, depending on the optical transparency of the foil material, contact with the medium "optical radiation" is possible with or without opening 46 in the foil material.

Figure 3B:
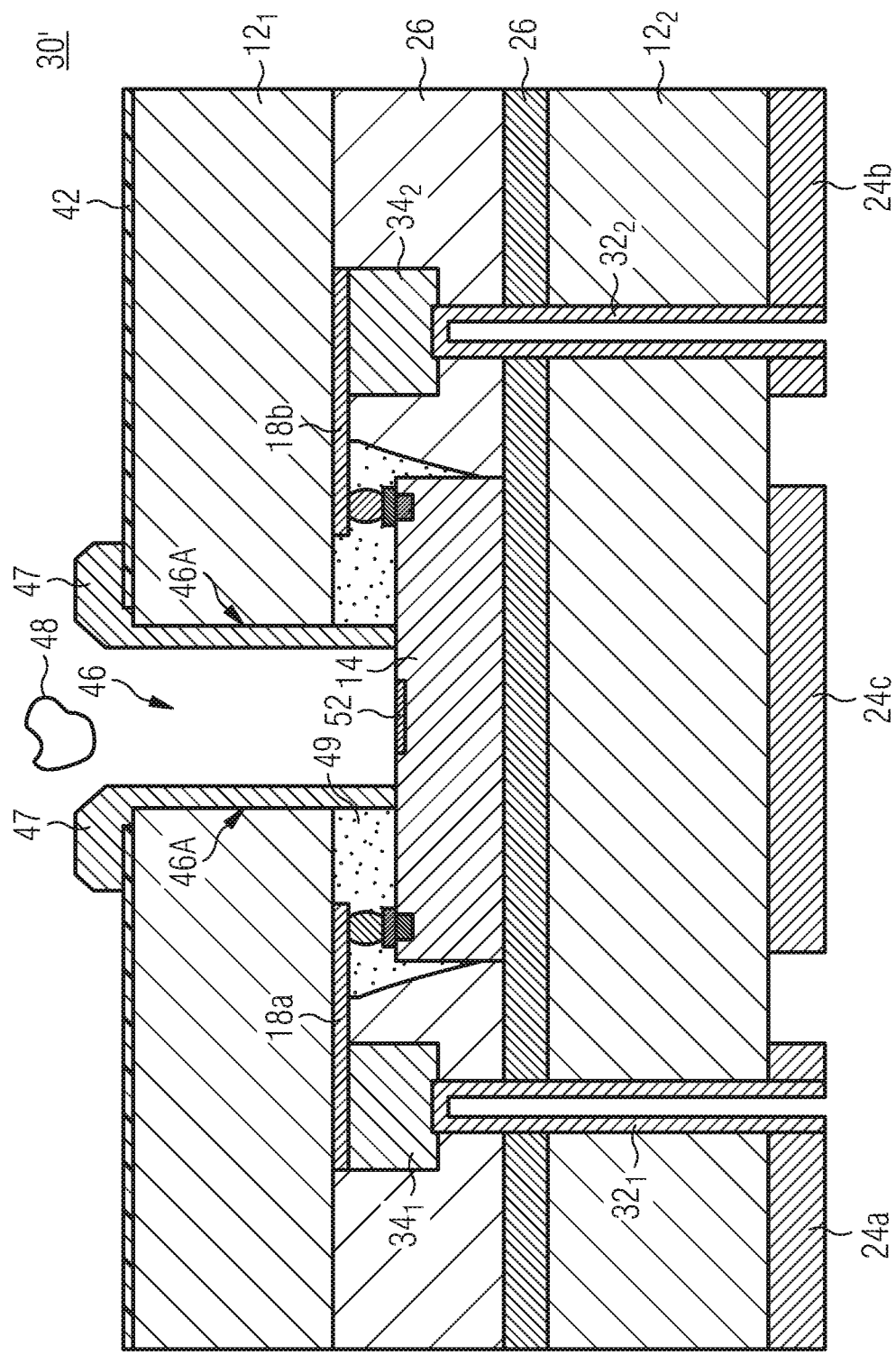
FIG. 3b is a schematic side-sectional view of a foil package according to an embodiment additionally comprising, compared to the foil package of FIG. 3a, a material layer covering a lateral side wall of the medium opening.

FIG. 3b shows a schematic side-sectional view of a foil package 30' according to an embodiment additionally comprising, compared to the foil package 30, a material layer 47 covering a lateral side wall 46A of the foil substrate $12_1$ allowing part of the medium access opening and which can separate, for example, the chip assembly material 49 from the sensory area 52. Alternatively or additionally, the material layer can provide a physical, mechanical and/or chemical barrier to protect the casting material 26, the foil substrate $12_1$, and/or the chip sampling material 49 from the medium 48.

Embodiments relate to medium access opening 46 in the package, such that the medium allows contact to the chip surface in a manner that the interaction between medium and chip is suitable for generating sensor signals. This means the opening 46 can also be implemented in the form of a transparent area covering the sensory area 52. In FIGS. 3a and 3b, conceptual arrangements of layers are shown. It has to be particularly considered that the lateral geometrical ratios (dimensions) are not shown to scale with the layer thicknesses. On a uniform scale the layer thicknesses in thin packages would be so low compared to lateral dimensions of the chips or packages that the layer sequence or order would possibly only be insufficiently reproducible. Vice versa, the region by which the chip surface can contact the medium appears laterally too small in the figures. However, the conceptual arrangement is also reproducible in details.

An opening 46 can be seen in the foil substrate, which can have suitable larger dimensions as it corresponds to the sensory area on the chip surface, i.e. the area 52. As a detail, it is outlined that when assembling the thin chip on the edge of the foil substrate opening 46, forming of the assembly material can take place. The recess in the protective layer on the second (outer) surface of the foil material is exemplarily outlined in a suitable greater manner than the opening in the foil substrate in order to visualize that depending on the production method of the opening and the recess in the protective layer no edge cover of the protective layer may occur at the opening of the foil substrate or merely little edge coverage occurs.

It is advantageous that electrical contacting of the foil package can take place on the package side facing away from the side with medium contact which allows protection of electrical contacting.

Figure 4:
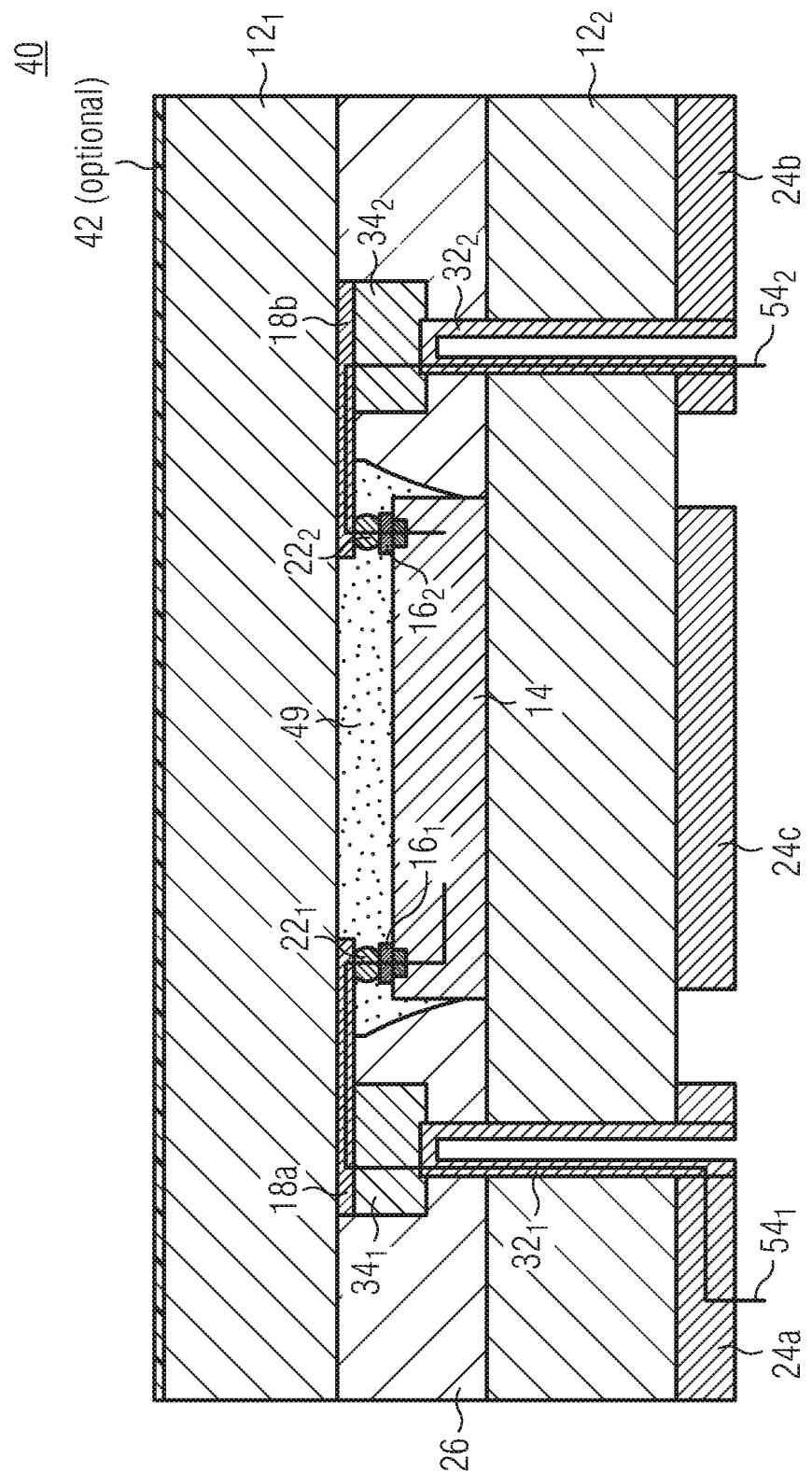
FIG. 4 is a schematic side-sectional view of a foil package according to an embodiment where a packaged electronic device is in direct contact with the foil substrate.

FIG. 4 shows a schematic side-sectional view of the foil package 40 according to an embodiment. Differing to FIG. 1 where the embedding material or casting material 26 can be between the interfaces of the electronic device 14 and the foil substrate $12_2$, the electronic device 14 can also directly contact the foil substrate $12_2$, which means the respective surface of the chip borders on the surface of the bottom foil substrate.

A first electrically conductive path $54_1$ extends between the package terminal pad 24a and the electronic device through the via $32_1$, the electrically conductive layer structure 18 in the form of the partial area 18a and optionally the electrically conductive element $34_1$ as well as through the connection $22_1$ and the device terminal $16_1$. A further electrically conductive path $54_2$ extends between the package terminal pad 22b and the electronic device 14 through the via $32_2$, the electrically conductive layer structure 18 in the form of the partial area 18b as well as the optional electrically conductive element $34_2$, the connection $22_2$ and the device terminal pad $16_2$.

In other words, FIG. 4 shows exemplarily and representatively for topological and topographical implementations a singled-out signal path 54 in connection with the layer order and the abutment of structures. Starting with the chip electronics, the signal travels through the IC pad including a pad bump, topographically projecting beyond the passivation level of the chip surface. Representative for the different possible connecting technologies (ACA, ACF, pillar, stud bump, SLID (solid liquid inter-diffusion)) or the same, a connecting element is provided between the chip and the conductive layer structure 18 on the top foil substrate $12_2$, i.e. the connections $22_1$ and $22_2$. On the one hand, the layer 18 borders on a first surface of the foil substrate and in the signal path, on the other hand, on a conductive layer, the elements $34_1$ and $34_2$ whose thickness can at least partially compensate for the topographical position ratios of the thickness of the ultrathin chip(s). In a different embodiment, this layer, i.e. the elements $34_1$ and $34_2$ may not exist, such that the via on the side of the foil substrate $12_2$ reaches or borders on the layer 18 or the respective partial area 18a or 18b. Now, the signal path 54 runs from the via to the package pad 24a or 24b, which can here, for example, be very similar to QFN packages and can mostly reach up to the outside contour of the package. Exemplarily, a conductive layer, i.e. the partial area 24c, can also be arranged in the center of the package pad layer 24 below the electronic device 14, which might exist or not, depending on the embodiment of the thin dual foil package. Possibly, this layer can also be used to be integrated at least as partial area of this layer in a signal path.

FIGS. 5a to 5g exemplarily show a method flow that describes how an inventive foil package can be produced. The foil package 50 obtained thereby can essentially correspond to the foil package 10, wherein an additional thickness $d_8$ of the casting material 26 between the electronic device 14 and the foil substrate $12_2$ is omitted, i.e. $d_8=0$. The optional barrier structure 42 including at least one barrier layer can be arranged on the foil substrate $12_1$ at the main surface $12A_1$. The electrically conductive layer 18 can be arranged on the main surface $12B_1$. The electrically conductive layer structure 18 can be structured such that signal paths lead separately, i.e. electrically isolated from one another, from the IC pads resulting to the outside in a direction of the edge of the foil package. In the figures, exemplarily, an arrangement is outlined where the signal paths do not completely reach up to the package edge. The electrically conductive layer structure 18 can consist of several layer parts, possibly of different orders of magnitude, wherein an interface to the foil substrate can have a characteristic for good adhesive strength of the electrically conductive layer structure 18. Here, different orders of magnitude means a relation of 40 nm adhesive layer to 400 nm or 4000 nm thickness of the electrically conductive layer of the layer structure 18. Such relations can occur multiple times in the layer parts of the electrically conductive layer structure 18.

Figure 5A:
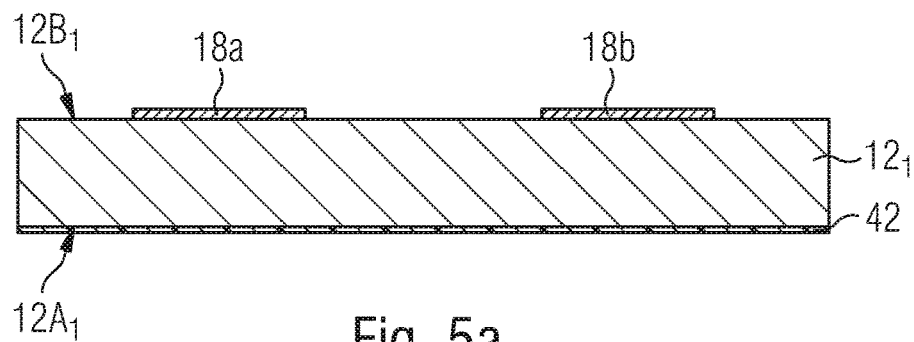
FIGS. 5a-5g are schematic illustrations of an exemplary method flow according to an embodiment describing how an inventive foil package can be produced.

FIG. 5a shows a schematic side-sectional view of the foil substrate $12_1$ on the main surface $12B_1$ of which the electrically conductive layer structure 18 is arranged and structured. The electrically conductive layer structure 18 can comprise at least one layer that is arranged adjacent to the first foil substrate $12_1$ and that provides adhesion of the electrically conductive layer structure 18 on the foil substrate $12_1$.

For this, an electrically conductive structured layer or layer arrangement that is relatively thin with values in the order of 10 µm can be generated on the foil substrate $12_1$. In specific embodiments, an order of 10 µm means, for example, within tolerance ranges 4 µm, 5 µm, 6 µm, 7 µm, 8 µm, 9 µm or 12 µm and can at least partly adjust the distance $d_7$.

The foil package is based on a foil substrate, wherein the thickness of the foil substrate $12_1$ can be, for example, approximately 125 µm, approximately 50 µm, approximately 25 µm or less than 25 µm. The relativization by approximately relates to production tolerances. As foil material, layers including polyimide (PI) or PEN (polyethylene naphthalate) or PET (polyethylene terephthalate) or PC (polycarbonate) or further materials as well as combinations thereof are considered. The selection of the material can be made, for example, in dependence on what temperatures act on the foil substrate, both during production of the foil packages as well as in the assembly process of the foil package in a system. Further, the temperatures act due to the operating state of the foil package during application, i.e. operating temperatures.

Figure 5B:
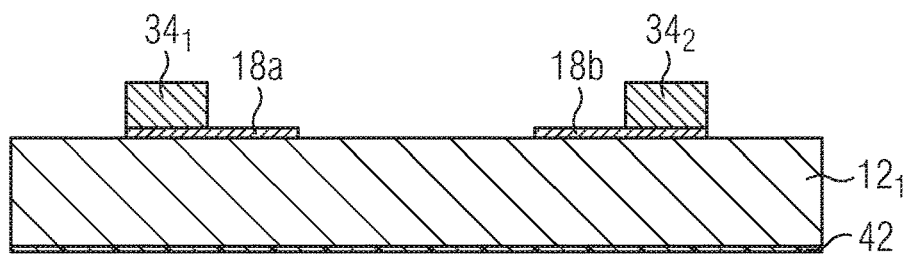

FIG. 5b shows a schematic side-sectional view of the foil substrate $12_1$, wherein the electrically conductive elements $34_1$ and $34_2$ have been deposited on the partial areas 18a and 18b, which can take place, for example by location-selective deposition or by deposition and subsequent structuring. Although arranging the partial areas 18a and 18b as well as of the electrically conductive elements $34_1$ and $34_2$ is illustrated as two separate steps, a respective arrangement can also take place at least simultaneously, for example by successive deposition of layers and simultaneous etching-out.

Figure 5C:
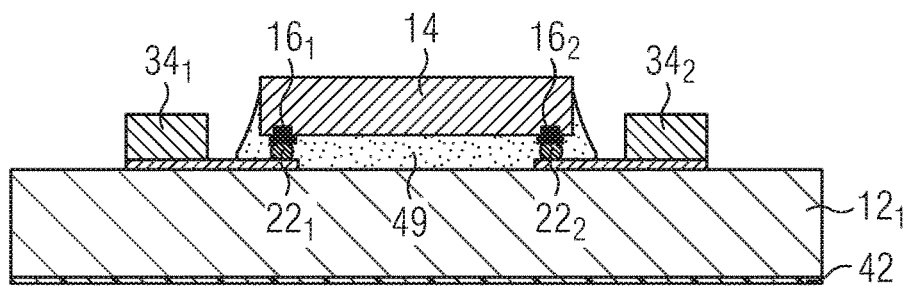

In FIG. 5c, the foil substrate $12_1$ is illustrated, wherein the electronic device 14 is arranged such that the device terminal pads $16_1$ and $16_2$ are connected to the partial areas 18a and 18b via the connections $22_1$ and $22_2$. Although only one metallization is illustrated in the area of the device terminal pads (IC pads), according to embodiments, electronic devices can comprise more than one metallization layer. The connections $22_1$ and $22_2$ can be realized, for example by bump metallizations topographically projecting from the passivation layer of the chip. The geometrical measure, by which the bumps topographically project, depends on the technology by which the bumps are generated. In so-called UBM technologies, the topography is, for example, <10 µm, in pillar technology, for example, >10 µm or in stud bump technology, for example, >20 µm. To realize the object of a thin foil package, advantages result when technologies having low geographical measures are used for the bumps.

Figure 5D:
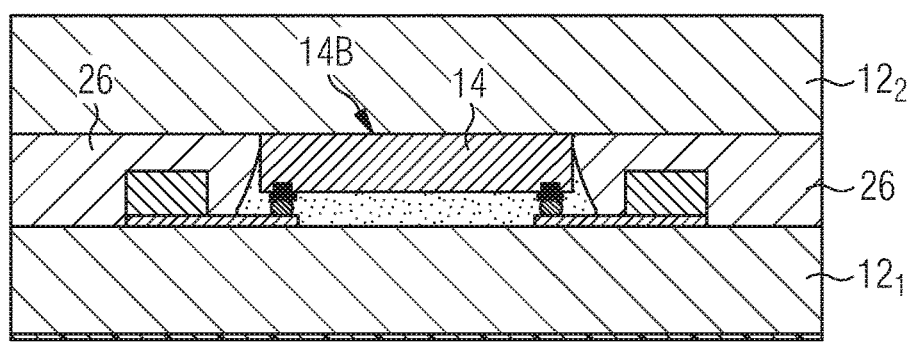

In FIG. 5d, the arrangement is supplemented by the casting material 26, wherein the casting material 26 can, for example, form a planar surface with the side 14B of the electronic device 14. On an even area with the side 14B obtained thereby, the foil substrate $12_2$ can be arranged and can form a stack with the foil substrate $12_1$ as well as the casting material 26 or the electronic device 14. As shown in the context of FIG. 1, the casting material 26 cannot only laterally cover the electronic device 14, but also on the side 14B, which allows a simple configuration of an even area for arranging the foil substrate $12_2$.

Figure 5E:
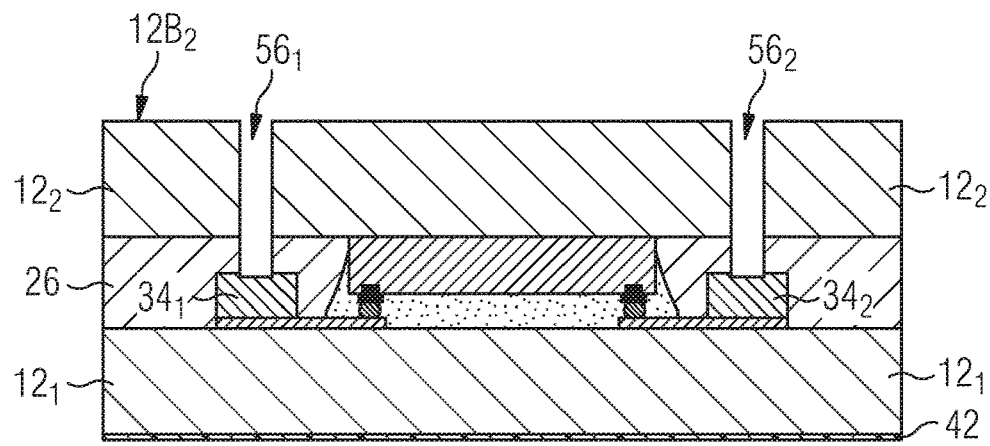

FIG. 5e shows a schematic side-sectional view of the foil arrangement where the openings $56_1$ and $56_2$ are generated starting from the main surface $12B_2$ in the direction of the electrically conductive elements $34_1$ and $34_2$, such as by using a punching method or an ablation method. The electrically conductive elements $34_1$ and $34_2$ can compensate tolerances of the method and can be partly ablated to allow good electrical contacting.

Figure 5F:
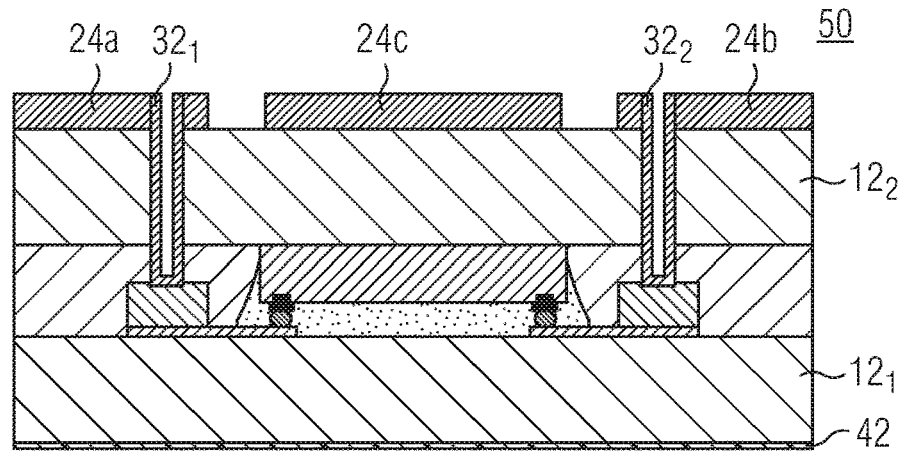

FIG. 5f shows a schematic side-sectional view of the structure, wherein the electrically conductive layer structure 24 is arranged. For example, by using galvanic technology, the electrically conductive layer structure 24 and vias $32_1$ and $32_2$ can be arranged simultaneously, for example by using subsequent structuring or location-selective deposition. This allows electrical contacting of the electrically conductive layer structure 24 and/or the vias $32_1$ and $32_2$ already during deposition and regarding the electrically conductive elements $34_1$ and $34_2$. Alternatively, for example when using a package pad punching element as via $32_1$ and/or $32_2$, an electrical connecting technology can be used for contacting the electrically conductive elements $34_1$ and $34_2$. As mentioned, when using galvanic technology, this connection can occur due to this galvanic technology. If the process of generating the openings $56_1$ and $56_2$ as well as arranging the vias $32_1$ and $32_2$ is controlled and/or configured precisely enough, the arrangement of the electrically conductive elements $34_1$ and $34_2$ can be omitted.

By arranging the electrically conductive layer structure with the partial areas 24a and 24b, the foil substrate $12_2$ can be provided with an electrically conductive structured layer whose geometrical arrangement towards the outside contour of the device can match the geometry of standard package pad configurations, for example SMD or QFN. An optional further structured region, for example the partial area 24c of this layer can be inserted or arranged below the positioning region of the chip(s) for improved heat dissipation. This is an optional implementation, wherein it should be noted that the partial area 24c can be made of an identical material as the partial areas 24a and 24b and/or the vias $32_1$ and $32_2$ without limitations, but also of a differing material, for example by a separate arrangement step.

In other words, by interaction of the chip thickness with the overall arrangement of an ultra-thin flex package, a further electrically conductive structured layer 24 is generated which can assume the geometries of the package pads. This layer 24 can, for example, be generated in additive galvanic technology. The specific configuration can be modified by engineers.

Figure 5G:
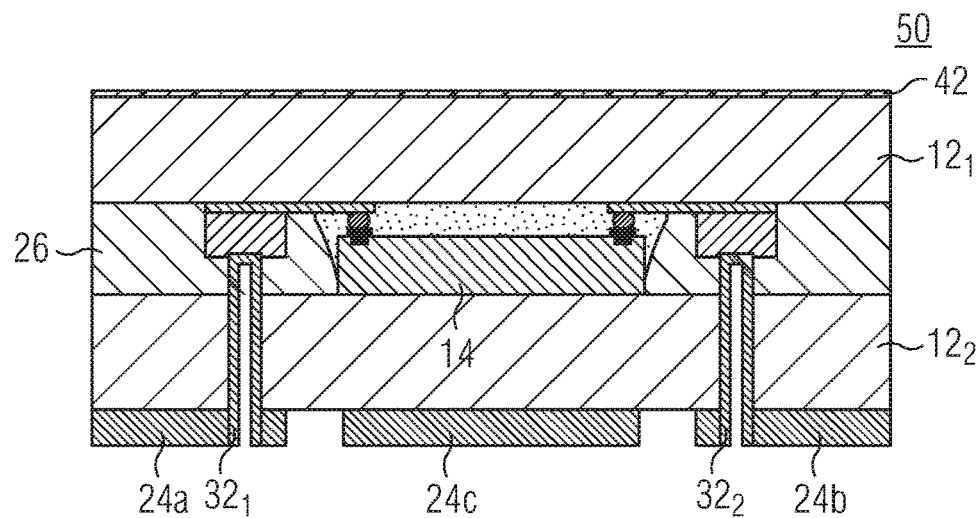

FIG. 5g shows a schematic side-sectional view of the foil package 50 obtained in FIG. 5 in a rotated view where, for example, an assembly of the foil package 50 can take place.

If the electronic device 14 is configured in a thin manner, for example by thinning the silicon material to less than an order of 50 µm, the silicon material can have a certain bendable characteristic. If the thickness of the silicon substrate is reduced, bending stresses and bending radii can be matched such that no Si chip breakage occurs, but still a function is obtained that cannot be provided by rigid devices. In applications, such as smart cards with integrated electronics, this function can be essential. The terminology of "less than an order of 50 µm" in the context of thinning silicon can, for example, be 60 µm, 50 µm, 40 µm, 30 µm, 15 µm or analogously.

The layer 42 already illustrated in FIG. 5a can implement an outer coating on the outside of the foil substrate $12_1$ as a further implementation of the foil package, which can be characterized by its barrier characteristic. The barrier characteristic can act against outer influences such as humidity or electromagnetic radiation, such as light. If the barrier characteristic is a low-resistance conductivity, this coating can act as electric shielding as described, for example, in the context of FIG. 2. There, an exemplary embodiment of an electrical connection between outer coating 42 and metallization 18 is illustrated, which can be configured as via. A number of one or several vias can be provided, wherein the geometrical location can be selected such that the desired electrical connection with a structured region in the layer 18 results. The layer 42 can comprise one or several layer parts that can be conductive and/or insulating, i.e. non-conductive layers. Although the layer 42 is already arranged in FIG. 5a, the same can be deposited at any later time.

The vias $32_1$ and $32_2$ can, for example, be configured as cylindrical bore or depression, or can be realized with another cross-sectional profile. Other cross-sections result, for example, in laser processing or chemical/electrochemical process, such as plasma etching. In through-connection by means of laser processing, for example, a funnel-shaped structure can be obtained.

Optionally, there can be at least one signal path from the optional layer 42 on the second surface of the top foil substrate $12_1$ to the conductive layer 18. This via is shown, for example in FIG. 2. This electrical connection is connected to a supply potential such that this outer layer corresponds to an electrical alternating field shielding.

The outer cover layer on the second surface of the top foil substrate $12_1$ can consist of several layers, wherein electrically conductive or electrically non-conductive layer parts are possible. Implementations are considered where an electrically non-conductive layer of the outer cover layer forms the interface to the environment.

Figure 6:
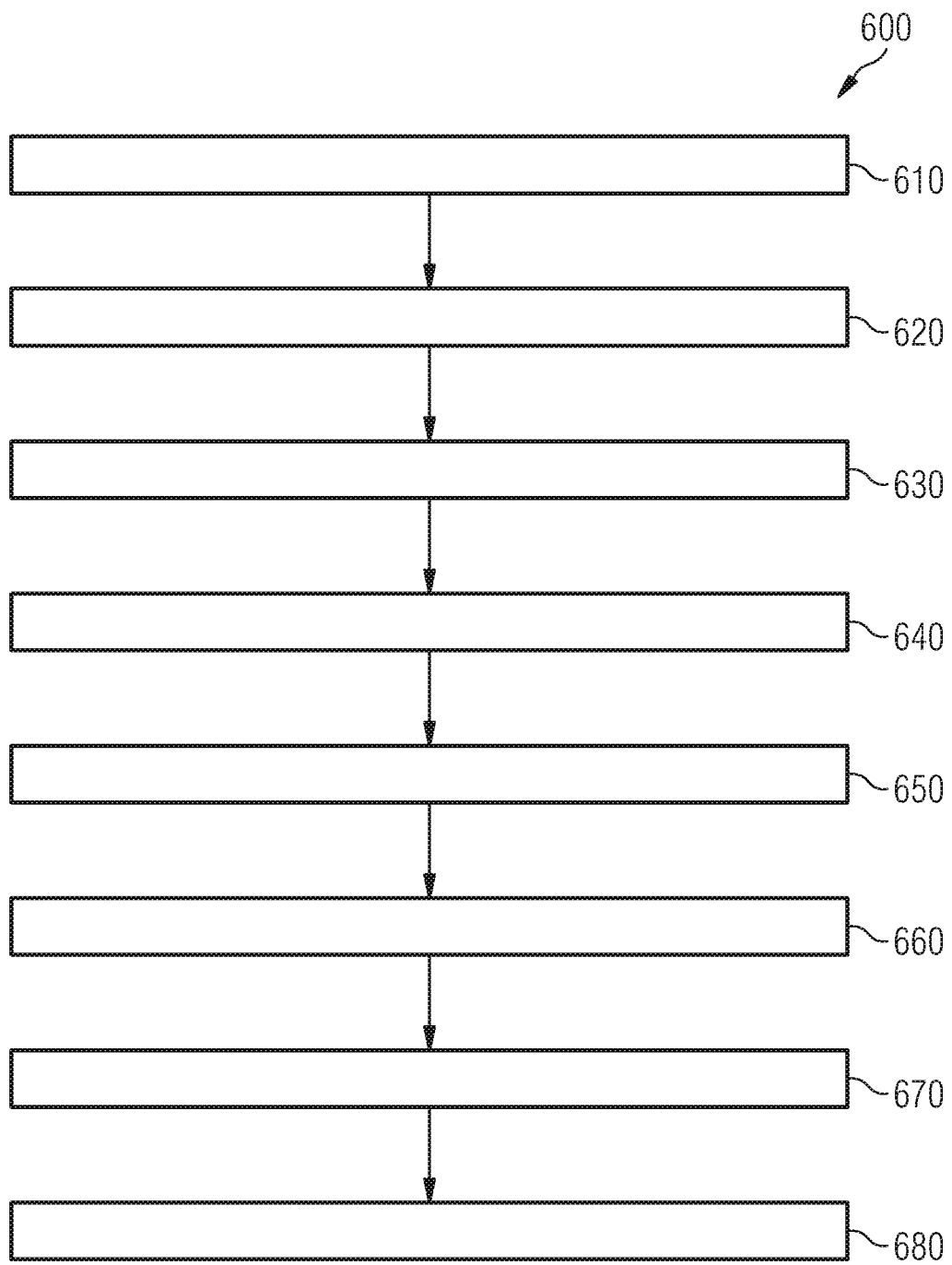
FIG. 6 is a schematic flow diagram of a method according to an embodiment that can be used to produce a foil package.

FIG. 6 shows a schematic flow diagram of a method 600 according to an embodiment, which can be used to produce a foil package.

In block 610, a first foil substrate, such as the foil substrate $12_1$, having a first main surface and an opposite second main surface is provided.

In block 620, a second foil substrate having a first main surface and an opposite second main surface is provided.

In block 630, at least one electronic device is arranged between the first foil substrate and the second foil substrate, such that the at least one electronic device comprises a terminal side and a side opposite to the terminal side, such that the terminal side is arranged facing the second main surface of the first foil substrate and comprises at least a first device terminal pad and a second device terminal pad and such that the opposite side is arranged facing the second foil substrate.

Block 640 includes arranging a first electrically conductive layer structure structured into a plurality of first partial areas on the second main surface of the first foil substrate such that the plurality of partial areas incompletely cover the second main surface of the first foil substrate.

Block 650 includes connecting the first and second device terminal pad via an electrically conductive non-detachable connection or conditionally detachable connection, respectively, to an allocated partial area of the first electrically conductive layer structure.

Block 660 includes arranging a casting compound between the first foil substrate and the second foil substrate, which contacts the first foil substrate and the at least one electronic device and delimits the same with respect to the environment.

Block 670 includes arranging a second electrically conductive layer structure structured into a plurality of package pads on the second main surface of the second foil substrate, such that the plurality of package pads incompletely cover the second main surface of the second foil substrate.

Step 680 includes arranging at least one first electrically conductive path, which electrically connects, by means of a via, a first package pad to a partial area of the first electrically conductive layer structure and hence to the first device terminal pad. Further, a second electrically conductive path is arranged, which electrically connects, by means of a via, a second package pad to a partial area of the first electrically conductive layer structure and hence to the second device terminal pad.

The method is configured such that the terminal area of the at least one electronic device is arranged extending in a reference plane and a projection of the first terminal pad and the second terminal pad into the reference plane is laterally adjacent and disjoint to the terminal area. Further, the method is configured such that the first package pad and the second package pad are arranged within a first tolerance range in a planar area parallel to the reference plane.

The method is configured such that the at least one electronic device has a dimension of a thickness direction perpendicular to the reference plane that is less than 60 µm. Alternatively or additionally, the first foil substrate has a dimension along the thickness direction that is less than 130 µm. Alternatively or additionally, the second foil substrate has a dimension along the thickness direction that is less than 130 µm. Alternatively or additionally, the first electrically conductive layer structure has a dimension along the thickness direction that is less than 20 µm.

Embodiments are particularly suitable for performing the method as roll-to-roll method by means of which, for example, at least one of the foil substrates $12_1$ and/or $12_2$ can be provided.

The terms "conductive layer" and "metallization" used herein differ in that a metallization includes a metallic substance, such as aluminum, copper, chrome, nickel, gold or other materials, as well as alloys thereof. On the other hand, a conductive layer includes electrically finite low-resistance particles in a material compound, such as silver particles in a paste material or micrometer beads of low/non-conductive material with conductive surface coating or the same. Embodiments described herein include electrically conductive layers, which relates to both the metallization as well as to the above-mentioned low-resistance particles. This means the electrically conductive layer is a generic term for both materials.

Embodiments provide the advantage that the configurations referred to as thin dual foil packages, in particular when the same have an overall height in the range of, for example 100 to 300 µm, are configured in a thin manner. The at least one semiconductor device (chip) is integrated between two foil substrates, such that, on the one hand, environmental influences only have a very limited effect on the chip, and, on the other hand, with functionally moderate bending stresses, the mechanical stress acting on the chip is so small that no chip breakage occurs, i.e. chip breakage is prevented. All in all, the described thin dual foil package allows moderate bending, since ultrathin semiconductor chips withstand such bending without breakage. The production process needs no process steps on the outer surface of the embedding material, which is a particular advantage when acidic or basic process chemicals act on this embedding material. In the foil package described herein, the chip is between two foils and is therefore mainly protected from environmental influences such as humidity, oxidation or mechanical damage.

Figure 7A:
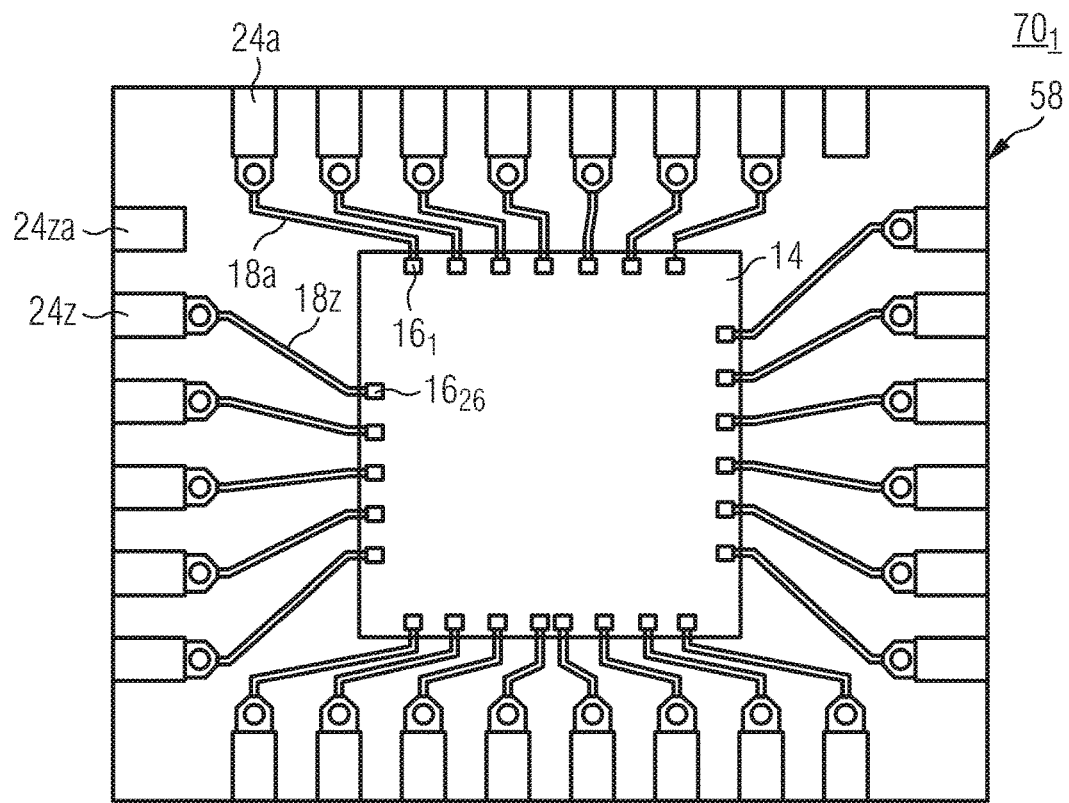
FIG. 7a is a schematic top view of a foil package according to an embodiment.

FIG. 7a shows a schematic top view of a foil package $70_1$ based on the foil package 10 whose configuration is compatible with the further configurations described in this context and that comprises, for example, a number of 26 device terminal pads 16, to 1626 connected to a respective number of partial areas 24a to 24z via a respective number of partial areas 18a to 18z and a respective number of vias, such that package pads connected to the partial areas 18a to 18z can be contacted. It becomes clear that a package outside contour 58 and/or geometrical arrangement of the package pads can be adapted arbitrarily. In that way, standardized geometries can be adjusted, such as by considering package pads in relation to the size and the distance of the pads to one another. The package pads can be arranged on one, several or all, such as four, sides around the device 14. The package pad can optionally also comprise partial areas 24 not in contact with the device 14 that are still in correspondence with the geometrical pattern, such as the partial area 24za.

The at least one, possibly thinned, electronic device 14 can be in a central area of the package. When arranging more than one electronic device, optionally, electrical connections can be arranged between the chips, possibly without a connection to package pads. In that case, device terminal pads can exist where no vias exist at the same location.

The chip pads can, for example, be arranged on a relatively short distance to the chip edge, wherein the following cases can occur:

a) The number of chip pads is greater than the number of package pads. This results in the fact that either individual chips have no connection to the package pads or occasionally more than one chip pad has a connection to a common package pad;

b) The number of chip pads is equal to the number of package pads. One-to-one allocation of chip pads to package pads can be carried out;

c) The number of chip pads is smaller than the number of package pads. Consequently, package pads remain unconnected to chip pads, device terminal pads or more than one package pad with a connection to a common chip pad.

According to the invention, through-connection of the bottom metallization 24 to the top metallization 18 takes place in the area of the chip pad regions.

The shape of the connecting conductive trace can be configured according to technical criteria, such as current density or the same or according to free design. An advantageous implementation is when the metallization bottom, i.e. the electrically conductive layer 16 is slightly greater than the area of the chip pads at the location where the chip pads contact this metallization. If the chip pads are arranged at a very short distance to one another, the top metallization may partly have no overlapping of the chip pads.

Figure 7B:
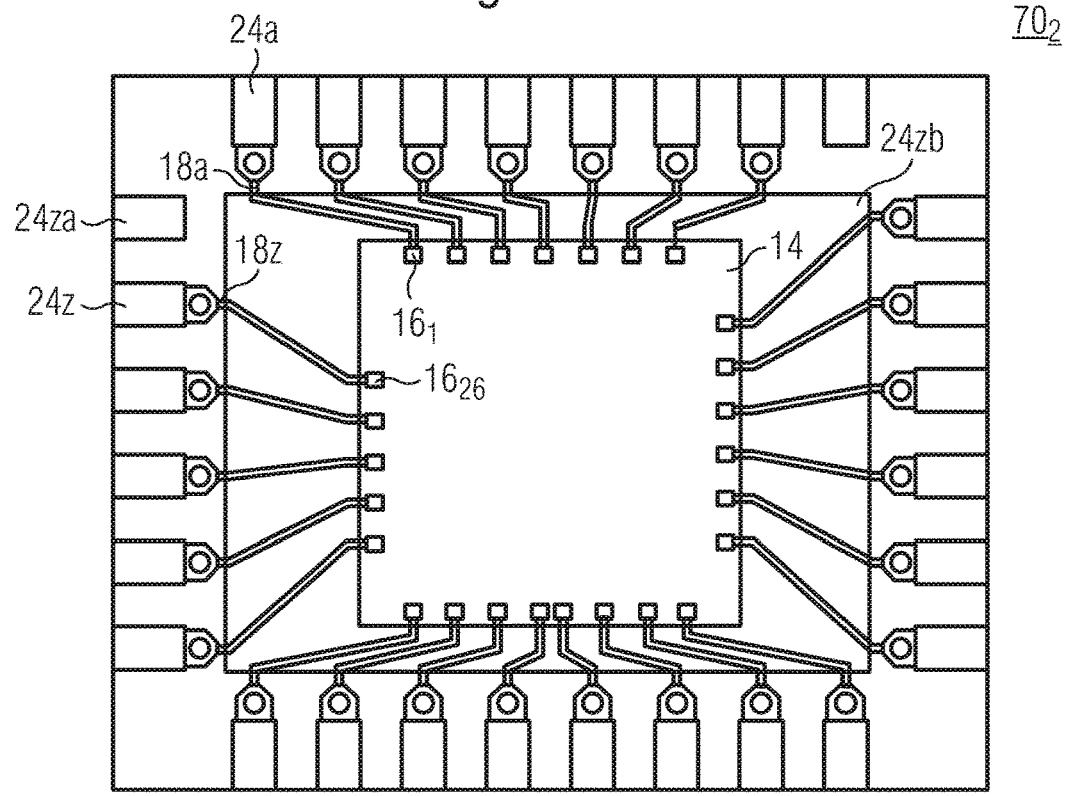
FIG. 7b is a schematic top view of a foil package according to an embodiment, additionally comprising, compared to the foil package of FIG. 7a, a metallization portion implementing an electrically conductive layer not connected to the electronic device.

FIG. 7b shows a schematic top view of a foil package $70_2$ additionally comprising, compared to the foil package $70_1$, a metallization portion $24zb$ that can functionally correspond, for example to the partial area $24c$ of FIG. 1, i.e. an electrically conductive layer not connected to the electronic device 14 can be arranged, for example, for cooling purposes.

Although some aspects have been described in the context of an apparatus, it is obvious that these aspects also represent a description of the corresponding method, such that a block or device of an apparatus also corresponds to a respective method step or a feature of a method step. Analogously, aspects described in the context of a method step also represent a description of a corresponding block or detail or feature of a corresponding apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. Foil package, comprising:
a first foil substrate with a first main surface and an opposite second main surface;
a second foil substrate with a first main surface and an opposite second main surface, wherein the first main surface of the second main foil substrate is arranged facing the second main surface of the first foil substrate;
at least one electronic device arranged between the first foil substrate and the second foil substrate;
a first electrically conductive layer structure structured into a plurality of first partial areas arranged on the second main surface of the first foil substrate, wherein the plurality of partial areas incompletely cover the second main surface of the first foil substrate;
wherein the at least one electronic device comprises a terminal side and a side opposite to the terminal side, wherein the terminal side is arranged facing the second main surface of the first foil substrate and comprises at least a first device terminal pad and a second device terminal pad; and wherein the opposite side is arranged facing the second foil substrate;
wherein the first and second device terminal pads are each electrically connected to an allocated partial area of the first electrically conductive layer structure via an electrically conductive non-detachable connection or conditionally detachable connection;
wherein the foil package further comprises a casting compound arranged between the first foil substrate and the second foil substrate mechanically contacting the first foil substrate and the at least one electronic device and delimiting the same with respect to the environment;
wherein the foil package further comprises a second electrically conductive layer structure structured into a plurality of package pads arranged on the second main surface of the second foil substrate, wherein the plurality of package pads incompletely cover the second main surface of the second foil substrate;
wherein at least a first electrically conductive path is arranged that electrically connects, by means of a via, a first package pad to a partial area of the first electrically conductive layer structure and hence to the first device terminal pad; and a second electrically conductive path is arranged that electrically connects, by means of a via, a second package pad to a partial area of the first electrically conductive layer structure and hence to the second device terminal pad;
wherein the first electrically conductive path and/or the second electrically conductive path laterally passes along the electronic device;
wherein the terminal side of the at least one electronic device extends in a reference plane and a projection of the first package pad and the second package pad into the reference plane is laterally adjacent and disjoint to the terminal area;
wherein the first package pad and the second package pad are arranged in a planar area parallel to the reference plane within a first tolerance range;
wherein the at least one electronic device comprises a dimension along a thickness direction that is perpendicular to the reference plane, the dimension being less than 60 µm; and
wherein the first foil substrate comprises a dimension along a thickness direction that is perpendicular to the reference plane and that is less than 130 µm; and
wherein the second foil substrate comprises a dimension along the thickness direction that is less than 130 µm; and
wherein the first electrically conductive layer structure comprises a dimension along the thickness direction that is less than 20 µm.

2. Foil package according to claim 1, wherein the first electrically conductive path runs laterally past the at least one electronic device and is configured to route an electrical signal between the first device terminal pad and the first package pad; and the second electrically conductive path runs laterally past the at least one electronic device and is configured to route an electrical signal between the second device terminal pad and the second package pad.

3. Foil package according to claim 1, wherein the casting material at least partly adjusts a distance between the first foil substrate and the second foil substrate, wherein the at least one electronic device is completely arranged within an area of the distance.

4. Foil package according to claim 1, wherein the at least one electronic device is configured to provide a sensor functionality based on contacting with a medium, wherein the first or second foil substrate comprises a medium opening that is configured to provide the contact between the at least one electronic device and the medium.

5. Foil package according to claim 1, wherein the electrically conductive non-detachable connection or conditionally detachable connection is a solder connection or an adhesive connection comprising an anisotropic electrically conductive adhesive.

6. Foil package according to claim 1, wherein the first foil substrate and/or the second foil substrate is flexible such that the foil package can be bent without destruction and in particular without damaging the at least one electronic device, wherein a bending radius is by at least 100 times greater than a dimension of the foil package along the thickness direction.

7. Foil package according to claim 1, wherein the first foil substrate and/or the second foil substrate comprises at least one of a polyimide layer, a polyethylene naphthalate layer, a polyethylene terephthalate layer and a polycarbonate layer.

8. Foil package according to claim 1, wherein the first electrically conductive layer structure is structured into a plurality of signal paths providing part of an electrical connection of a plurality of device terminal pads of the at least one electronic device to the second electrically conductive layer structure.

9. Foil package according to claim 1, wherein the first electrically conductive layer structure comprises at least one layer that is arranged adjacent to the first foil substrate and that provides adhesion of the first electrically conductive layer structure to the first foil substrate.

10. Foil package according to claim 1, wherein the dimension of the first conductive layer structure comprises, in the area of contact with an electrical path, a greater dimension along the thickness direction compared to an area of the electrically non-detachable or conditionally detachable connection.

11. Foil package according to claim 1, wherein the first electrically conductive path and/or the second electrically conductive path is formed in a plugged-via shape starting from the second foil substrate.

12. Foil package according to claim 1, comprising a barrier structure arranged on the first main surface of the first foil substrate and/or the second main surface of the second foil substrate and providing a barrier for humidity and/or electromagnetic radiation.

13. Foil package according to claim 12, wherein the barrier structure comprises a first barrier layer formed in a low-resistance manner and providing electrical shielding.

14. Foil package according to claim 13, wherein a first barrier layer is connected in an electrically low-resistance manner to a supply potential of the at least one electronic device or to a package pad.

15. Foil package according to claim 12, wherein a first barrier layer of the barrier structure is connected in an electrically low-resistance manner to the electrically conductive layer structure.

16. Foil package according to claim 12, wherein the barrier structure comprises a second barrier layer that is formed in an electrically insulating manner.

17. Foil package according to claim 16, wherein the second barrier layer at least partly forms an outside of the foil package.

18. Foil package according to claim 1, wherein the package pads are arranged in an SMD raster or QFN raster.

19. Foil package according to claim 1, further comprising a material layer on the side of the first main surface of the first foil substrate or on the side of the second main surface of the second foil substrate providing labelling of the foil package.

20. Foil package according to claim 1 wherein a thickness of the foil package is of at most 350 μm.

21. The foil package according to claim 1, wherein the first terminal pad and the second terminal pad are arranged in a first plane and wherein the plurality of package pads is arranged in a second plane being parallel to the first plane.

22. Method for producing a foil package, comprising:
providing a first foil substrate with a first main surface and an opposite second main surface;
providing a second foil substrate with a first main surface and an opposite second main surface;
arranging at least one electronic device between the first foil substrate and the second foil substrate;
such that the at least one electronic device comprises a terminal side and a side opposite to the terminal side, such that the terminal side is arranged facing the second main surface of the first foil substrate and comprises at least a first device terminal pad and a second device terminal pad; and such that the opposite side is arranged facing the second foil substrate;
arranging a first electrically conductive layer structure structured into a plurality of first partial areas on the second main surface of the first foil substrate, such that the plurality of partial areas incompletely cover the second main surface of the first foil substrate;
connecting the first and second device terminal pad each via an electrically conductive non-detachable connection or conditionally detachable connection to an allocated partial area of the first electrically conductive layer structure;
arranging a casting compound between the first foil substrate and the second foil substrate contacting the first foil substrate and the at least one electronic device and delimiting the same with respect to the environment;
arranging a second electrically conductive layer structure structured into a plurality of package pads on the second main surface of the second foil substrate such that the plurality of package pads incompletely cover the second main surface of the second foil substrate;
arranging at least one first electrically conductive path electrically connecting, by means of a via, a first package pad to a partial area of the first electrically conductive layer structure and hence to the first device terminal pad; and a second electrically conductive path electrically connecting, by means of a via, a second package pad to a partial area of the first electrically conductive layer structure and hence to the second device terminal pad; such that the first electrically conductive path and/or the second electrically conductive path laterally passes along the electronic device;
such that the terminal area of the at least one electronic device extends in a reference plane and a projection of the first terminal pad and the second terminal pad into the reference plane is laterally adjacent and disjoint to the terminal area;
such that the first package pad and the second package pad are arranged in a planar area parallel to the reference plane within a first tolerance range;
such that the at least one electronic device comprises a dimension along a thickness direction that is perpendicular to the reference plane, the dimension being less than 60 μm; and
such that the first foil substrate comprises a dimension along the thickness direction that is less than 130 μm; and
such that the second foil substrate comprises a dimension along the thickness direction that is less than 130 μm; and
such that the first electrically conductive layer structure comprises a dimension along the thickness direction that is less than 20 μm.

23. Method according to claim 22, configured as roll-to-roll method.

* * * * *